(12) United States Patent
Tsutsui et al.

(10) Patent No.: US 10,637,413 B2
(45) Date of Patent: Apr. 28, 2020

(54) SEMICONDUCTOR DEVICE

(71) Applicant: Murata Manufacturing Co., Ltd., Kyoto (JP)

(72) Inventors: Takayuki Tsutsui, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 61 days.

(21) Appl. No.: 16/112,938

(22) Filed: Aug. 27, 2018

(65) Prior Publication Data

US 2019/0068142 A1 Feb. 28, 2019

(30) Foreign Application Priority Data

Aug. 28, 2017 (JP) ................. 2017-163087

(51) Int. Cl.
*H03F 3/213* (2006.01)
*H03H 7/01* (2006.01)
(Continued)

(52) U.S. Cl.
CPC ............ *H03F 3/213* (2013.01); *H01L 23/62* (2013.01); *H01L 23/66* (2013.01); *H01L 24/13* (2013.01); *H01L 24/16* (2013.01); *H01L 27/0248* (2013.01); *H01L 27/0647* (2013.01); *H03F 1/52* (2013.01); *H03F 1/565* (2013.01); *H03F 3/195* (2013.01); *H03F 3/245* (2013.01); *H03H 7/0115* (2013.01); *H03H 7/1758* (2013.01);
(Continued)

(58) Field of Classification Search
CPC .... H01L 24/13; H03H 7/0115; H03H 7/1758; H03H 2001/0085; H03F 2200/402; H03F 3/213

USPC ........................................................ 333/185
See application file for complete search history.

(56) References Cited

U.S. PATENT DOCUMENTS

2005/0009484 A1   1/2005  Imai et al.
2016/0013758 A1*  1/2016  Cao ...................... H03F 1/0222
                                                        330/297

FOREIGN PATENT DOCUMENTS

JP          2005033350          2/2005

OTHER PUBLICATIONS

Daehyun Kang et al., "A Highly Efficient and Linear Class-AB/F Power Amplifier for Multimode Operation", IEEE Transactions on Microwave Theory and Techniques, Jan. 2008, p. 77-87 vol. 56, No. 1, IEEE.

* cited by examiner

Primary Examiner — Rakesh B Patel
(74) Attorney, Agent, or Firm — Pearne & Gordon LLP

(57) ABSTRACT

A semiconductor device includes the following elements. A chip has a main surface substantially parallel with a plane defined by first and second directions intersecting with each other. A power amplifier amplifies an input signal and outputs an amplified signal from plural output terminals. First and second filter circuits attenuate harmonics of the amplified signal. The first filter circuit includes a first capacitor connected between the plural output terminals and a ground. The second filter circuit includes a second capacitor connected between the plural output terminals and a ground. On the main surface of the chip, the plural output terminals are disposed side by side in the first direction, and the first capacitor is disposed on a side in the first direction with respect to the plural output terminals, while the second capacitor is disposed on a side opposite the first direction with respect to the plural output terminals.

20 Claims, 13 Drawing Sheets

(51) Int. Cl.
  *H01L 23/00* (2006.01)
  *H01L 27/02* (2006.01)
  *H01L 27/06* (2006.01)
  *H03F 3/195* (2006.01)
  *H01L 23/66* (2006.01)
  *H03F 1/52* (2006.01)
  *H03F 1/56* (2006.01)
  *H01L 23/62* (2006.01)
  *H03F 3/24* (2006.01)
  *H03F 3/217* (2006.01)
  *H01L 25/07* (2006.01)

(52) U.S. Cl.
  CPC ............ *H01L 24/48* (2013.01); *H01L 25/072* (2013.01); *H01L 27/0203* (2013.01); *H01L 2223/6611* (2013.01); *H01L 2223/6627* (2013.01); *H01L 2223/6655* (2013.01); *H01L 2224/06* (2013.01); *H01L 2224/13147* (2013.01); *H01L 2224/16157* (2013.01); *H01L 2224/4813* (2013.01); *H01L 2224/48227* (2013.01); *H01L 2224/49175* (2013.01); *H01L 2924/1203* (2013.01); *H01L 2924/1205* (2013.01); *H01L 2924/13051* (2013.01); *H01L 2924/13091* (2013.01); *H01L 2924/19032* (2013.01); *H01L 2924/19042* (2013.01); *H01L 2924/30111* (2013.01); *H03F 3/217* (2013.01); *H03F 3/2176* (2013.01); *H03F 2200/111* (2013.01); *H03F 2200/171* (2013.01); *H03F 2200/222* (2013.01); *H03F 2200/267* (2013.01); *H03F 2200/318* (2013.01); *H03F 2200/387* (2013.01); *H03F 2200/402* (2013.01); *H03F 2200/411* (2013.01); *H03F 2200/451* (2013.01); *H03H 2007/013* (2013.01)

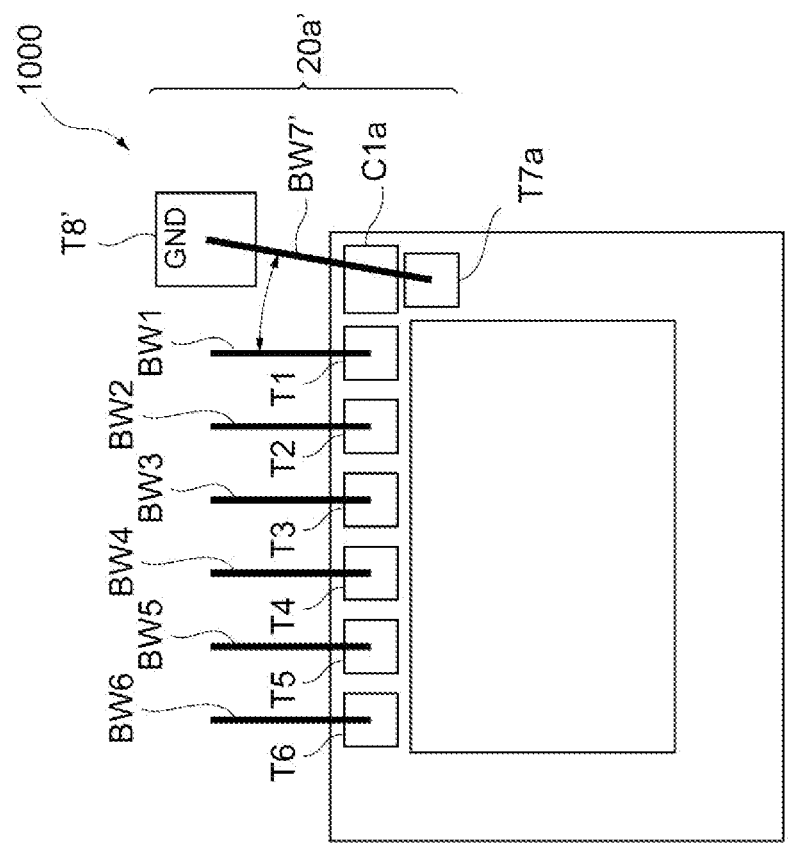

freq(1GHz to10GHz)

freq(1GHz to10GHz)

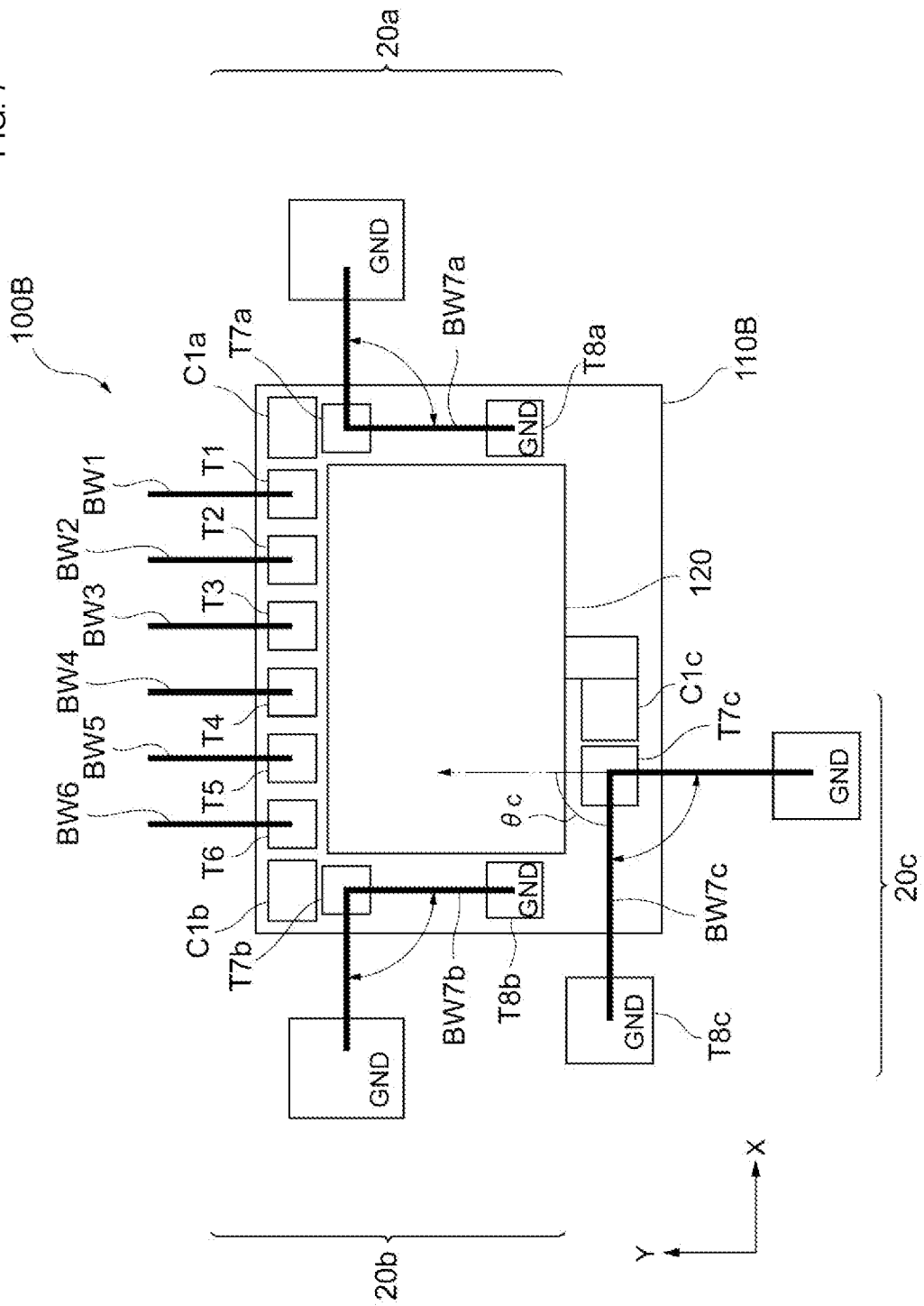

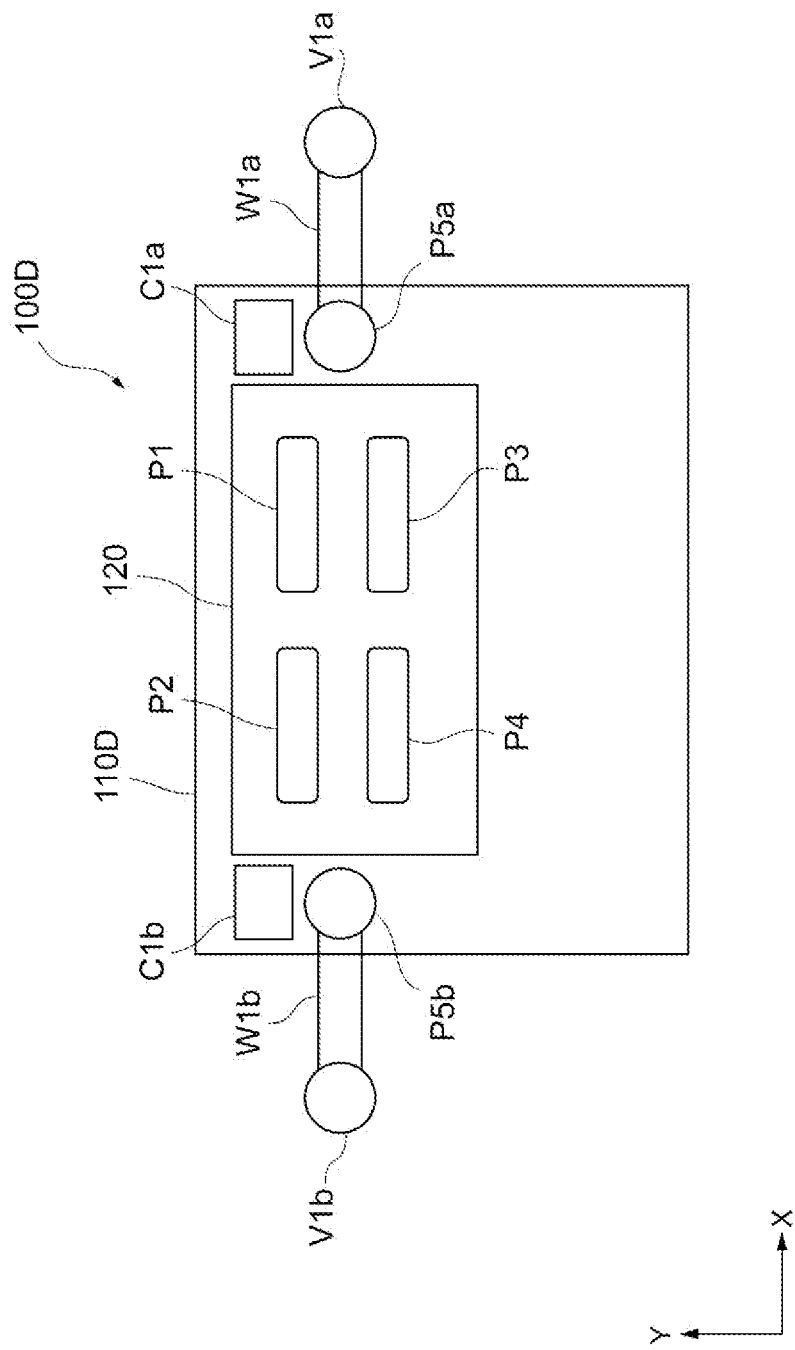

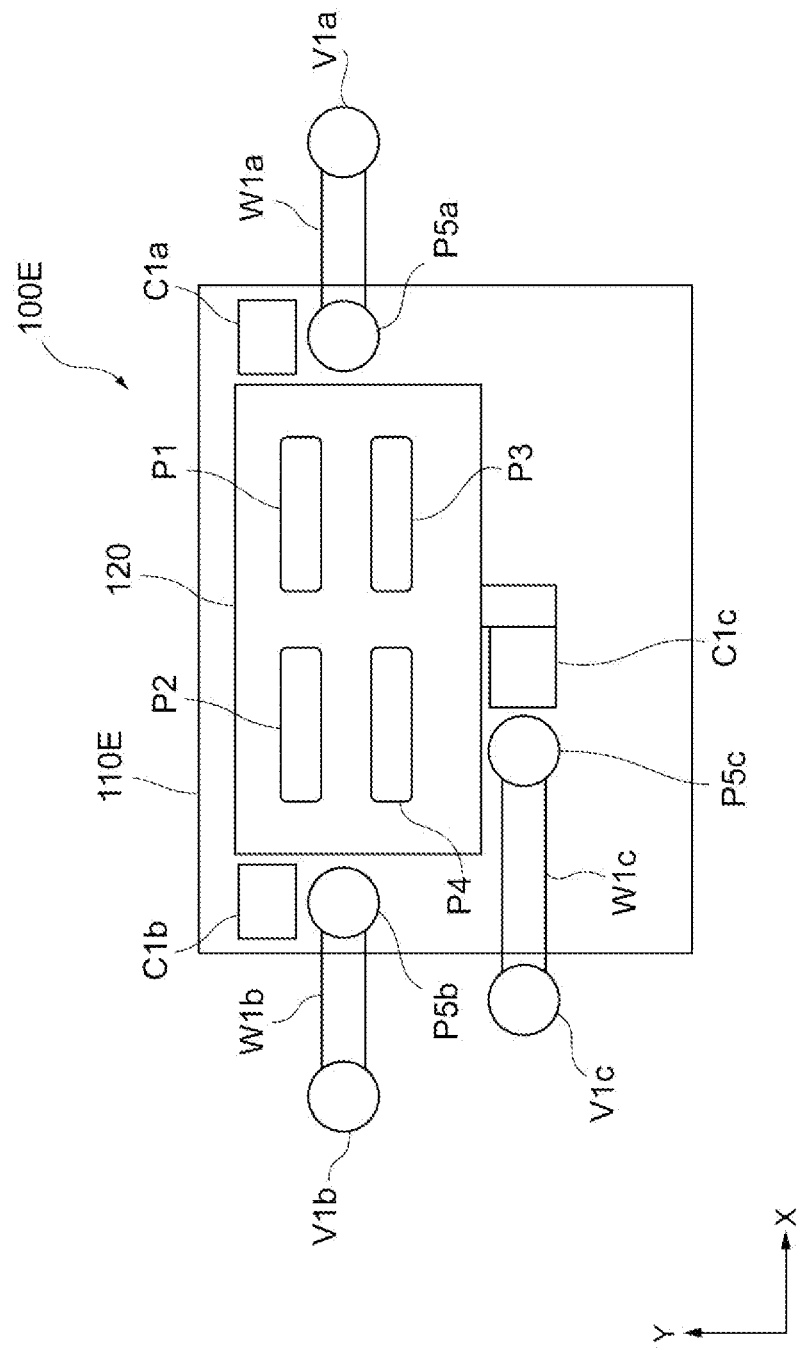

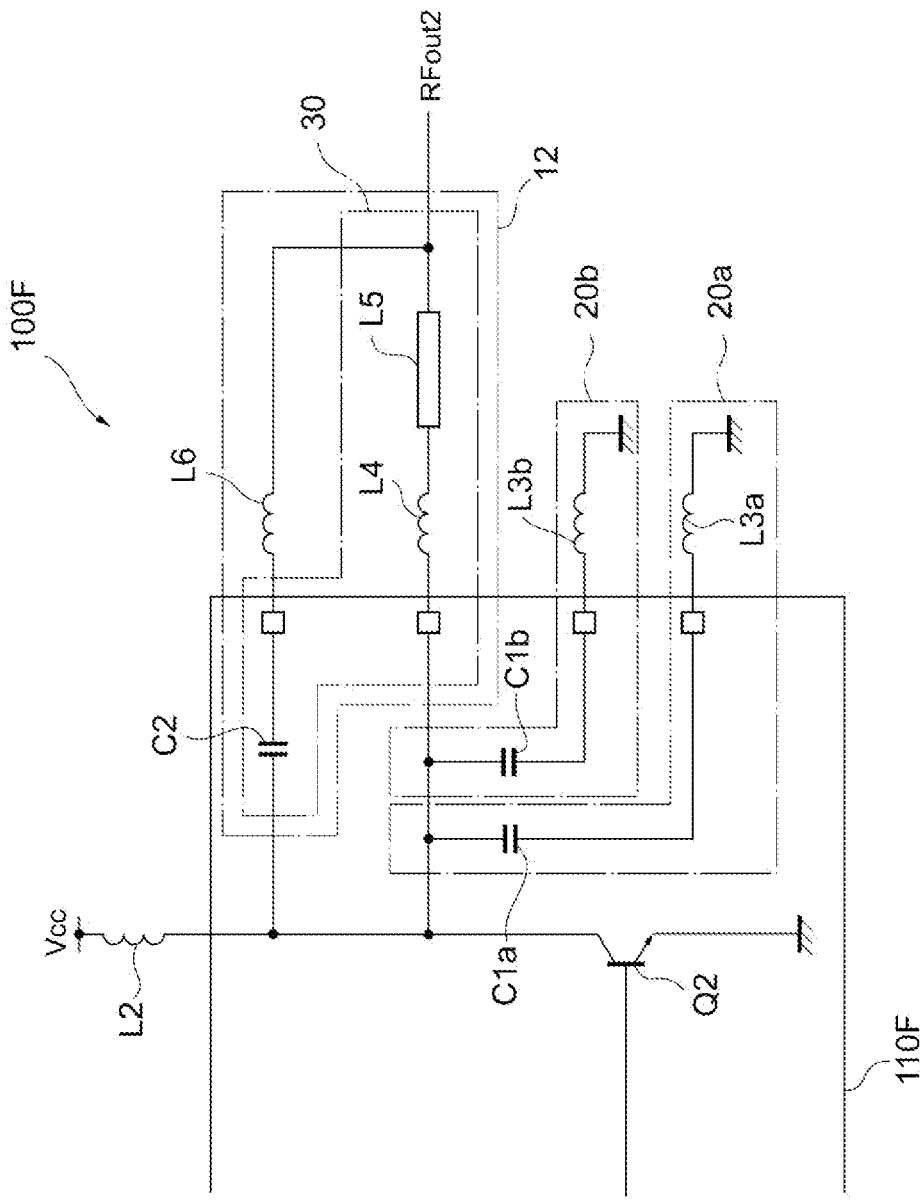

SEMICONDUCTOR DEVICE

This application claims priority from Japanese Patent Application No. 2017-163087 filed on Aug. 28, 2017. The content of this application is incorporated herein by reference in its entirety.

BACKGROUND

The present disclosure relates to a semiconductor device. In mobile communication devices, such as cellular phones, to increase the transmission capacity, more and more frequency bands are being used, as seen in the carrier aggregation (CA) technology, for example. This increases the complexity of the circuit configuration of a power amplifier circuit and the subsequent stages, thereby increasing loss in a path from the power amplifier circuit to an antenna. To address this issue, it is desirable to increase output power of the power amplifier circuit.

Daehyun Kang, Daekyu Yu, Kyoungjoon Min, Kichon Han, Jinsung Choi, Dongsu Kim, Boshi Jin, Myoungsu Jun, and Bumman Kim, "A Highly Efficient and Linear Class-AB/F Power Amplifier for Multimode Operation", IEEE Transactions on Microwave Theory and Techniques, Vol. 56, No. 1, January 2008, p 77-87 discloses a technology of operating a power amplifier by controlling harmonics in the following manner. By short-circuiting second-order harmonics of a transmit signal to a ground and by opening third-order harmonics thereof, the power amplifier is caused to perform class F operation. Class F operation is known as a technique for achieving compatibility between high linearity and high efficiency of a power amplifier.

BRIEF SUMMARY

Nowadays, however, the frequency of a transmit signal is becoming higher, and the frequency of harmonics of the transmit signal is accordingly becoming higher (several gigahertz to several dozens of gigahertz, for example), which may make it difficult to control harmonics. Even if the constant of a filter circuit is set so that the resonant frequency of the filter circuit may coincide with the frequency of second-, third-, or n-order (n is an integer) harmonics of a transmit signal, it is difficult to set the impedance of the filter circuit to be sufficiently low. This is due to the influence of mutual coupling between elements forming the filter circuit and parasitic capacitance and parasitic resistance generated in the filter circuit. Suitable designing of a filter circuit is thus necessary.

In view of the above-described background, the present disclosure provides a semiconductor device including a power amplifier circuit mounted thereon which can improve the controllability of harmonics.

According to embodiments of the present disclosure, there is provided a semiconductor device including a chip, a power amplifier, and first and second filter circuits. A chip has a main surface which is substantially parallel with a plane defined by first and second directions intersecting with each other. The power amplifier amplifies an input signal and outputs an amplified signal from a plurality of output terminals. The first and second filter circuits attenuate harmonics of the amplified signal. The first filter circuit includes a first capacitor connected between the plurality of output terminals and a ground. The second filter circuit includes a second capacitor connected between the plurality of output terminals and a ground. On the main surface of the chip, the plurality of output terminals are disposed side by side in the first direction, and the first capacitor is disposed on a side in the first direction with respect to the plurality of output terminals, while the second capacitor is disposed on a side opposite the first direction with respect to the plurality of output terminals.

According to embodiments of the present disclosure, it is possible to provide a semiconductor device including a power amplifier circuit mounted thereon which can improve the controllability of harmonics.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 4 is a diagram illustrating an example of the arrangement of a semiconductor device according to a comparative example of the semiconductor device shown in FIG. 2;

FIG. 7 is a diagram illustrating an example of the arrangement of a semiconductor device according to a second embodiment of the disclosure;

FIG. 9 is a diagram illustrating an example of the arrangement of a semiconductor device according to a fourth embodiment of the disclosure;

FIG. 10 is a diagram illustrating an example of the arrangement of a semiconductor device according to a fifth embodiment of the disclosure; and FIG. 11 is a schematic circuit diagram of a semiconductor device according to a sixth embodiment of the disclosure and also schematically illustrates an example of the arrangement of the semiconductor device.

DETAILED DESCRIPTION

Figure 1:
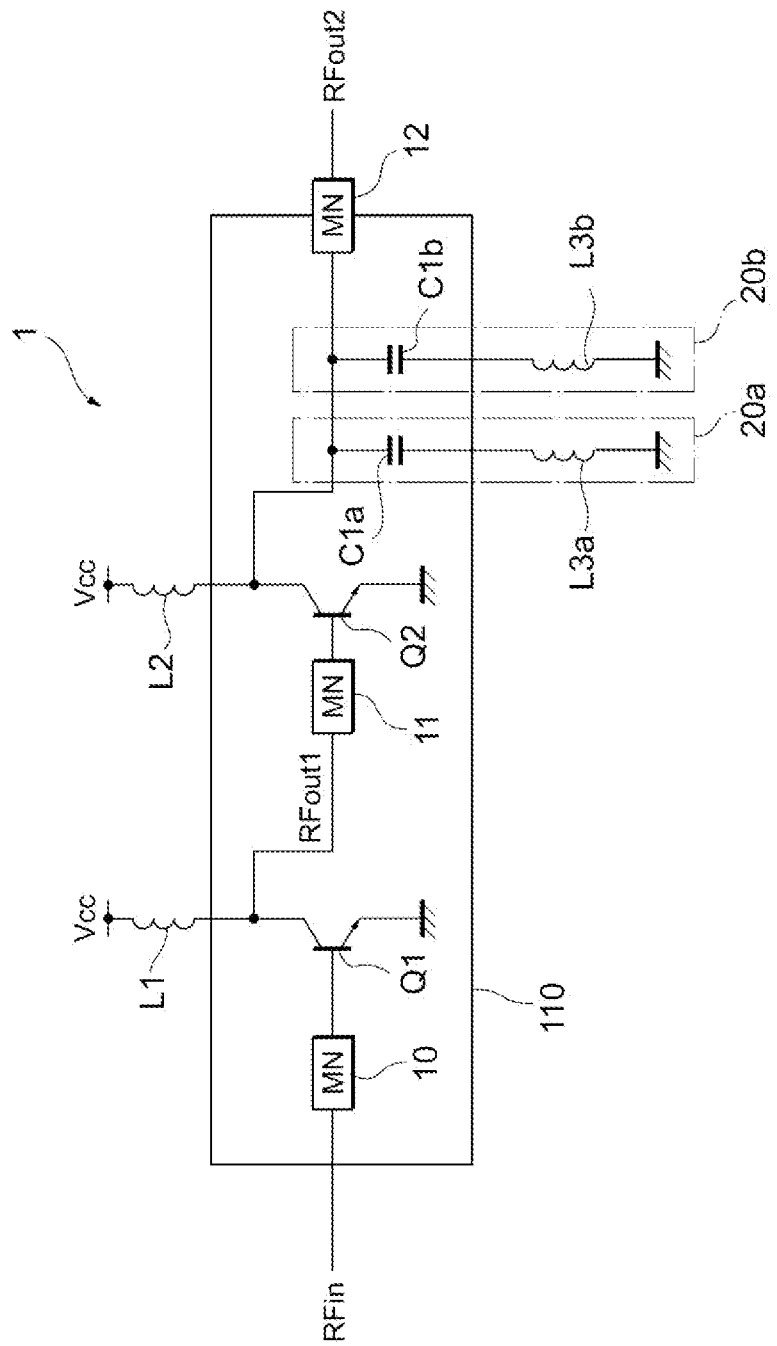
FIG. 1 is a circuit diagram of a power amplifier circuit to be mounted on a semiconductor device according to a first embodiment of the disclosure.

Embodiments of the present disclosure will be described below in detail with reference to the accompanying drawings. The same element is designated by like reference numeral, and an explanation thereof will be given only once and will not be repeated.

FIG. 1 is a circuit diagram of a power amplifier circuit 1 to be mounted on a semiconductor device according to a first embodiment of the disclosure. The power amplifier circuit 1 amplifies an input signal, which is a radio frequency (RF) signal and outputs an amplified signal. The frequency of the input signal is about several hundreds of megahertz to several gigahertz, for example.

The power amplifier circuit 1 includes transistors Q1 and Q2, matching networks (MN) 10, 11, and 12, filter circuits 20a and 20b, and inductors L1 and L2. All of or at least some of these elements are formed on a semiconductor chip 110, which will be discussed later.

The transistors Q1 and Q2 each amplify an RF signal. In the first embodiment, the transistors Q1 and Q2 are bipolar transistors, such as heterojunction bipolar transistors (HBTs). The transistors Q1 and Q2 may be another type of transistor, such as a metal-oxide-semiconductor field-effect transistor (MOSFET).

The transistor Q1 forms a first-stage (drive-stage) power amplifier, while the transistor Q2 forms a second-stage (power-stage) power amplifier. This will be explained more specifically. In the transistor Q1, an input signal RFin is supplied to the base via the matching network 10, a power supply voltage Vcc is supplied to the collector via the inductor L1, and the emitter is grounded. The transistor Q1 amplifies the input signal RFin and outputs an amplified signal RFout1 from the collector. In the transistor Q2, the amplified signal RFout1 is supplied to the base via the matching network 11, a power supply voltage Vcc is supplied to the collector via the inductor L2, and the emitter is grounded. The transistor Q2 amplifies the amplified signal RFout1 and outputs an amplified signal RFout2 from the collector. A bias current or voltage is supplied from a bias circuit to the base of each of the transistors Q1 and Q2, though it is not shown. In the first embodiment, two stages of amplifiers are provided. However, the power amplifier circuit 1 may include one stage of an amplifier or three or more stages of amplifiers.

The matching network 10 is disposed in a stage preceding the transistor Q1, the matching network 11 is disposed in a stage preceding the transistor Q2, and the matching network 12 is disposed in a stage following the transistor Q2. The matching networks 10 through 12 are each constituted by a capacitor and an inductor and are used for performing impedance matching between the corresponding circuits.

The inductors L1 and L2 are choke inductors for reducing a leakage of an RF signal to a power source. The inductors L1 and L2 are represented by the symbol of inductance elements for the convenience of description. However, the inductors L1 and L2 may be constituted by another element having inductance components, such as a bonding wire. Inductors L3a and L3b, which will be discussed later, may also be constituted by an element having inductance components other than an inductance element.

The filter circuits 20a and 20b (first and second filter circuits) attenuate harmonic components contained in the amplified signal RFout2 output from the collector of the transistor Q2. The filter circuit 20a is a series resonance circuit including a capacitor C1a (first capacitor) and an inductor L3a (first wiring) connected in series with each other. Likewise, the filter circuit 20b is a series resonance circuit including a capacitor C1b (second capacitor) and an inductor L3b (second wiring) connected in series with each other. The filter circuit 20a will be taken as an example to describe the specific configuration of the filter circuits 20a and 20b.

One end of the capacitor C1a is connected to the collector of the transistor Q2, and the other end thereof is grounded via the inductor L3a. The inductor L3a may be a bonding wire having inductance components, which is used for connecting the other end of the capacitor C1a to a ground. With this configuration, the filter circuit 20a serves as a series resonance circuit that resonates at a resonant frequency $f_0$ $(=1/2\pi\sqrt{LC})$ (Hz) which is determined by the capacitance C of the capacitor C1a and the inductance L of the inductor L3a. If the constants of the capacitor C1a and the inductor L3a are determined so that the resonant frequency $f_0$ of the filter circuit 20a may coincide with the frequency of harmonics of the amplified signal RFout2, the reactance components of the capacitor C1a and the inductor L3a ideally become zero and the impedance of the frequency of harmonics in the filter circuit 20a as viewed from the collector of the transistor Q2 also becomes low. The filter circuit 20a thus serves as a harmonic termination circuit that short-circuits harmonics to a ground. The configuration of the filter circuit 20b is similar to that of the filter circuit 20a, and a detailed explanation thereof will thus be omitted.

If the filter circuits 20a and 20b short-circuit even-order harmonics, such as second-order harmonics, of the amplified signal RFout2 and open odd-order harmonics, such as third-order harmonics, of the amplified signal RFout2, in a signal line, the transistor Q2 operates as a class F power amplifier to perform class F operation. In contrast, if the filter circuits 20a and 20b short-circuit odd-order harmonics, such as third-order harmonics, and open even-order harmonics, such as second-order harmonics, in a signal line, the transistor Q2 operates as an inverse class F power amplifier to perform inverse class F operation. Both of the class F operation and inverse class F operation are the following operation mode. The voltage phase and the current phase are adjusted so that the peak of the voltage waveform and that of the current waveform do not overlap each other so as to reduce loss of power (=voltage×current). This can achieve the compatibility between high linearity and high efficiency of the power amplifier. It is known that, theoretically, inverse class F operation achieves higher linearity and higher efficiency than class F operation. A description will be given, assuming that the resonant frequency of both of the filter circuits 20a and 20b is the frequency of third-order harmonics of the amplified signal RFout2.

The reason why the power amplifier circuit 1 includes two filter circuits having the same resonant frequency will be discussed below with reference to FIG. 2.

Figure 2:
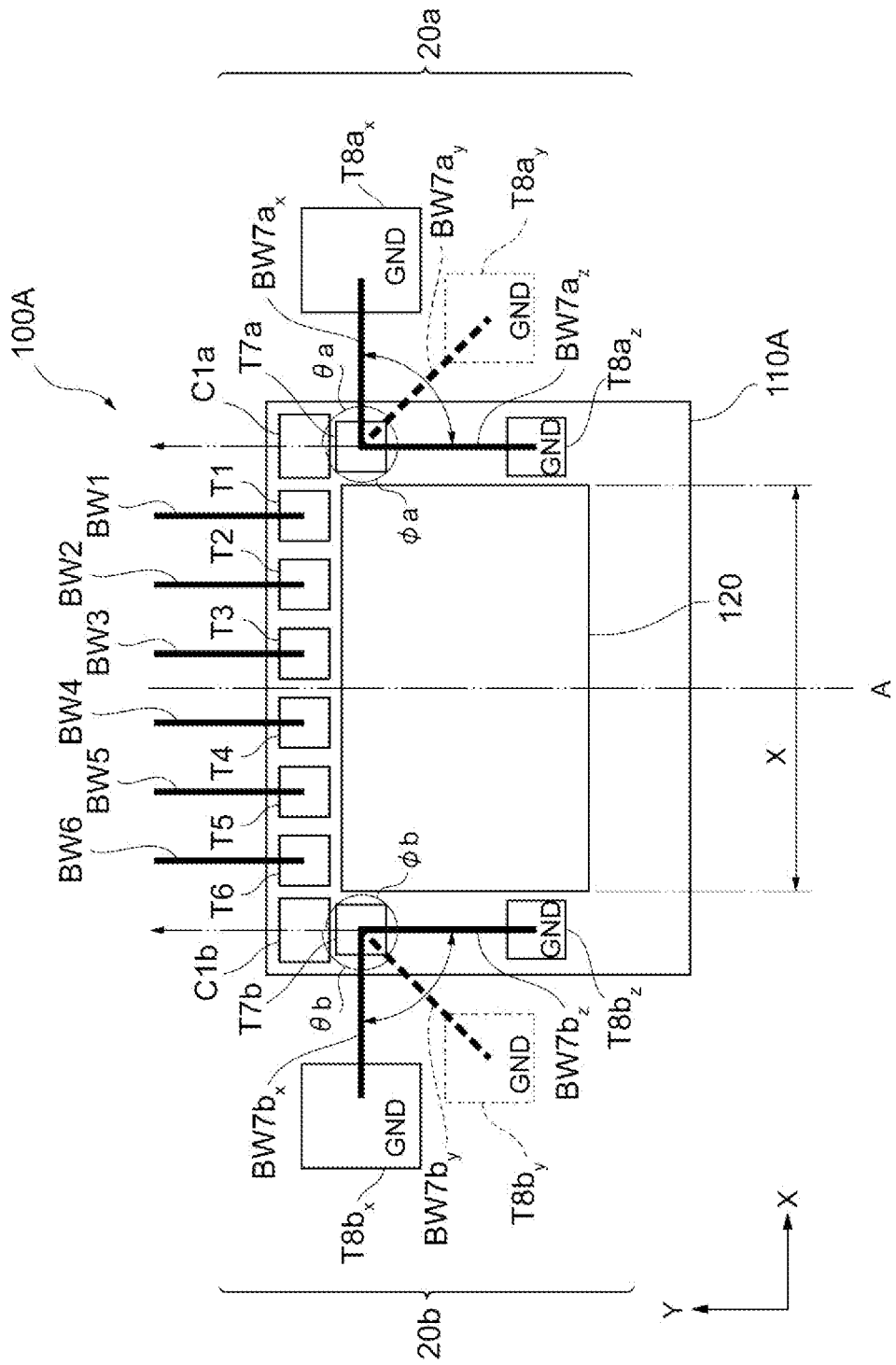
FIG. 2 is a diagram illustrating an example of the arrangement of a semiconductor device according to the first embodiment.

FIG. 2 is a diagram illustrating an example of the arrangement of a semiconductor device 100A according to the first embodiment. In the semiconductor device 100A, the elements forming the above-described power amplifier circuit 1 are formed on a semiconductor chip 110A. Among the elements shown in FIG. 2, those corresponding to the elements shown in FIG. 1 are designated by like reference numerals, and an explanation thereof will thus be omitted.

The semiconductor device 100A includes the semiconductor chip 110A, an HBT region 120, capacitors C1a and C1b, terminals T1 through T6, T7a, T7b, T8a (T8$a_x$, T8$a_y$, T8$a_z$), and T8b (T8$b_x$, T8$b_y$, T8$b_z$), and bonding wires BW1 through BW6, BW7a (BW7$a_x$, BW7$a_y$, BW7$a_z$), and BW7b (BW7$b_x$, BW7$b_y$, BW7$b_z$).

The semiconductor chip 110A has a main surface formed in a substantially rectangular shape which is parallel with a plane defined by X and Y axes intersecting with each other (crossing at right angles in FIG. 2). The main surface has a long side parallel with the X-axis positive direction (first direction) and a short side parallel with the Y-axis positive direction (second direction). The HBT and other elements are mounted on the semiconductor chip 110A, and the semiconductor chip 110A is mounted on a module substrate, for example.

In the HBT region 120, the transistor Q2 shown in FIG. 1, for example, is formed. The transistor Q2 is constituted by plural fingers, each of which is the minimum unit of a transistor, connected in parallel with each other. These plural fingers are arranged in the HBT region 120. In the first embodiment, in a plan view of the main surface of the semiconductor chip 110A, the HBT region 120 is substantially rectangular, and the length of the HBT region 120 in the X-axis direction is indicated by X.

The terminals T1 through T6 (plural output terminals) are collector terminals electrically connected to the collector of the transistor Q2. The terminals T1 through T6 are arranged in the X-axis direction on the main surface of the semiconductor chip 110A. Although the six terminals T1 through T6 are arranged in FIG. 2, more terminals or fewer terminals may be provided.

The bonding wires BW1 through BW6 (plural third wirings) respectively extend from the terminals T1 through T6 in the Y-axis positive direction. The bonding wires BW1 through BW6 are wirings for connecting the collector of the transistor Q2 to the outside of the semiconductor chip 110A when the semiconductor chip 110A is mounted on a module substrate.

The capacitors C1a and C1b are those included in the filter circuits 20a and 20b, respectively, shown in FIG. 1. The capacitors C1a and C1b are on-chip capacitors, for example, directly formed on the semiconductor chip 110A. More specifically, the capacitor C1a is disposed on the positive side in the X-axis direction (side in the first direction) with respect to the terminals T1 through T6, while the capacitor C1b is disposed on the negative side in the X-axis direction (side opposite the first direction) with respect to the terminals T1 through T6. That is, the capacitors C1a and C1b are disposed symmetrically with each other with respect to a line A at the center of the semiconductor chip 110A in the X-axis direction.

The bonding wire BW7a (first wiring) extends from the terminal T7a, which is the other end of the capacitor C1a, to the terminal T8a (first ground terminal). That is, the bonding wire BW7a serves as the inductor L3a of the filter circuit 20a shown in FIG. 1 while connecting the other end of the capacitor C1a to a ground. Likewise, the bonding wire BW7b (second wiring) extends from the terminal T7b, which is the other end of the capacitor C1b, to the terminal T8b (second ground terminal). That is, the bonding wire BW7b serves as the inductor L3b of the filter circuit 20b shown in FIG. 1 while connecting the other end of the capacitor C1b to a ground.

It is assumed that the semiconductor device 100A includes only one of the filter circuits 20a and 20b (filter circuit 20a only, for example). In this case, the collectors of all the plural fingers arranged in the HBT region 120 are connected to the filter circuit 20a via wirings laid in the HBT region 120. In this configuration, the lengths of the wirings which connect the collectors of the individual fingers and the filter circuit 20a become different depending on the position at which the finger is formed in the HBT region 120. More specifically, the length of the wiring in the X-axis direction from the finger positioned closest to the filter circuit 20a to the filter circuit 20a is different from that from the finger positioned farthest from the filter circuit 20a to the filter circuit 20a by an amount of X. Assuming that the wirings form a distributed circuit, when the frequency of the amplified signal RFout2 is relatively high, a difference in the length of the wiring may vary the characteristics of the filter circuit 20a. This is undesirable particularly when the fundamental frequency is relatively high in a case in which the filter circuit 20a short-circuits n-order harmonics (n is an integer), such as second-, third-, or fourth-order harmonics, of the amplified signal RFout2.

Figure 3:
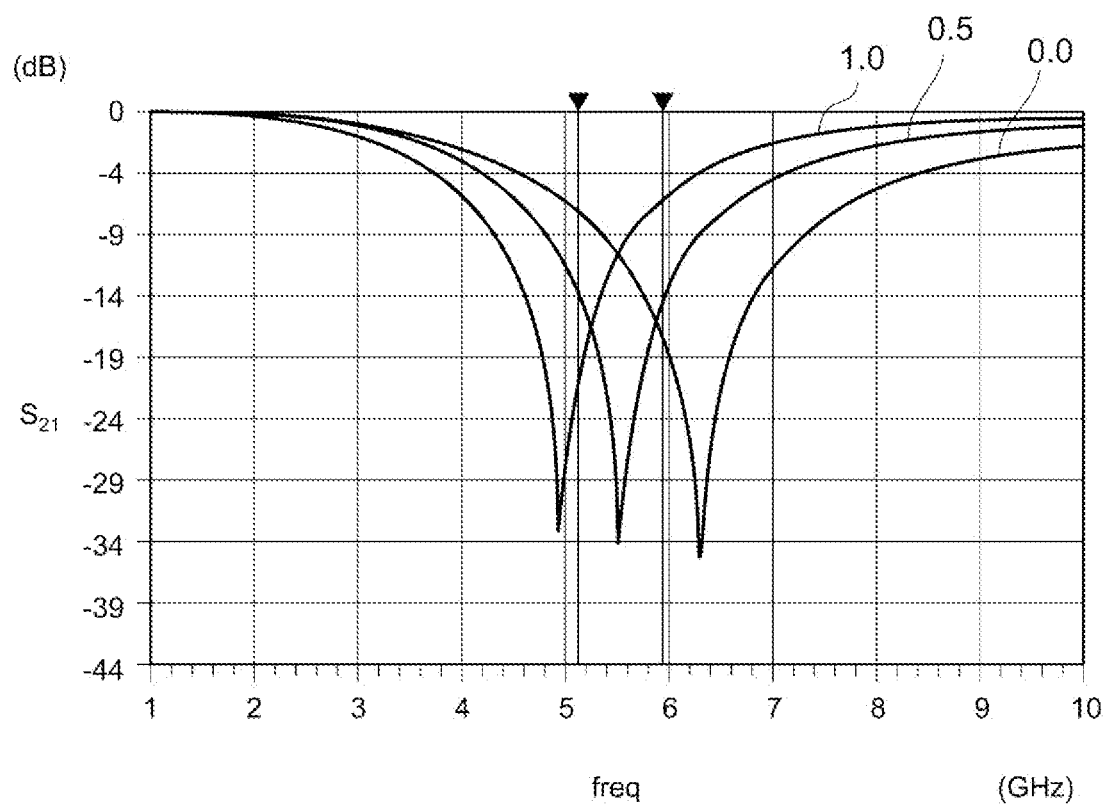
FIG. 3 is a graph illustrating the simulation results of the frequency characteristics of a filter circuit according to the length of wiring from the collector of a finger to the filter circuit.

FIG. 3 is a graph illustrating the simulation results of the frequency characteristics of the filter circuit 20a according to the length of wiring from the collector of the finger to the filter circuit 20a. More specifically, FIG. 3 illustrates the simulation results of the scattering (S) parameter $S_{21}$ of the output from the transistor Q2 when the distance from the collector of the finger to the capacitor C1a of the filter circuit 20a is about 0.0 mm, 0.5 mm, and 1.0 mm. In the graph of FIG. 3, the vertical axis indicates the S parameter $S_{21}$ (dB), while the horizontal axis indicates the frequency (GHz).

FIG. 3 shows that a signal of a predetermined frequency is significantly attenuated, regardless of the distance from the collector of the finger to the capacitor C1a. FIG. 3 also shows that the frequency characteristics vary depending on a difference in the above-described distance. Comparing the distance of about 0.0 mm with that of about 1.0 mm, the frequency of the peak of the attenuation pole varies by about 1 GHz or greater. If the frequency range to be attenuated is about 5.13 to 5.94 GHz, the highest frequency of this range is not sufficiently attenuated when the distance is about 1.0 mm, while the lowest frequency of this range is not sufficiently attenuated when the distance is about 0.0 mm. The reason for this is that the resonant frequency of the filter circuit 20a deviates because of a difference in the inductance components of the wiring from the collector of the finger to the capacitor C1a. The deviation in the resonant frequency becomes undesirable when the filter circuit 20a short-circuits second- or third-order harmonics of an amplified signal.

When the frequency of a signal is relatively high, coupling capacitance generated between wirings may also influence the characteristics of the filter circuits 20a and 20b. This will be discussed below.

FIG. 4 is a diagram illustrating an example of the arrangement of a semiconductor device 1000 according to a comparative example of the semiconductor device 100A. For the sake of description, elements corresponding to those of the semiconductor device 100A shown in FIG. 2 are designated by like reference numerals.

As shown in FIG. 4, in the semiconductor device 1000, a bonding wire BW7' for connecting the terminal T7a to a ground extends from the terminal T7a to a terminal T8' (ground terminal) in the Y-axis positive direction. With this arrangement, the bonding wire BW7' is positioned close to the bonding wire BW1 extending from the terminal T1 in the Y-axis positive direction, which is the same extending direction of the bonding wire BW7', thereby generating coupling between the bonding wires BW7' and BW1.

Figure 5A:
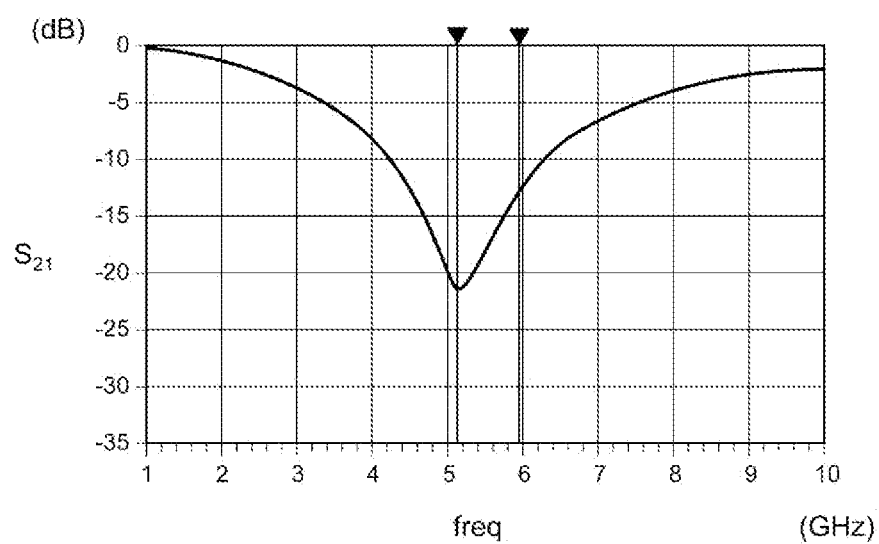
FIG. 5A is a graph illustrating the simulation results of the frequency characteristics of a filter circuit in the semiconductor device shown in FIG. 4.
Figure 5B:
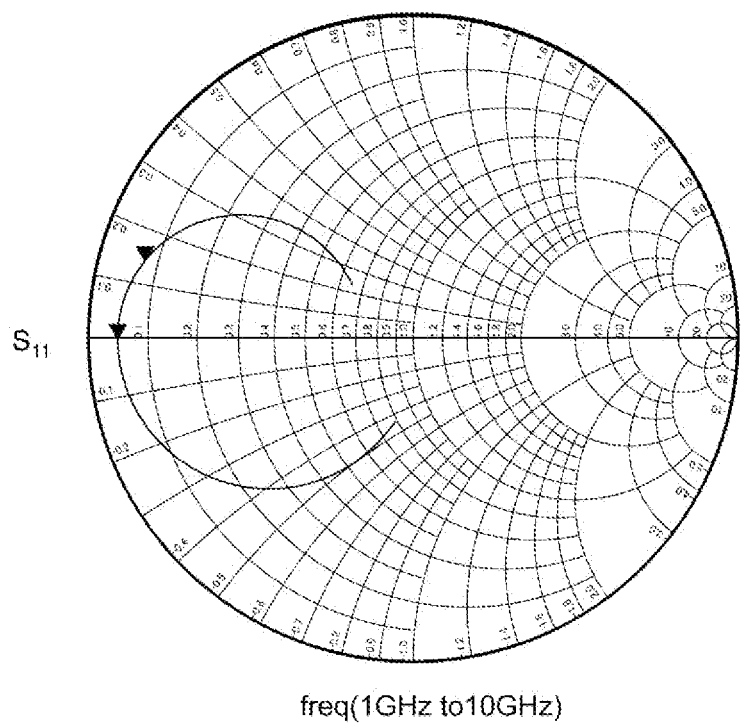
FIG. 5B is a Smith chart illustrating a path of load impedance of the collector of a transistor in the semiconductor device shown in FIG. 4.
Figure 6A:
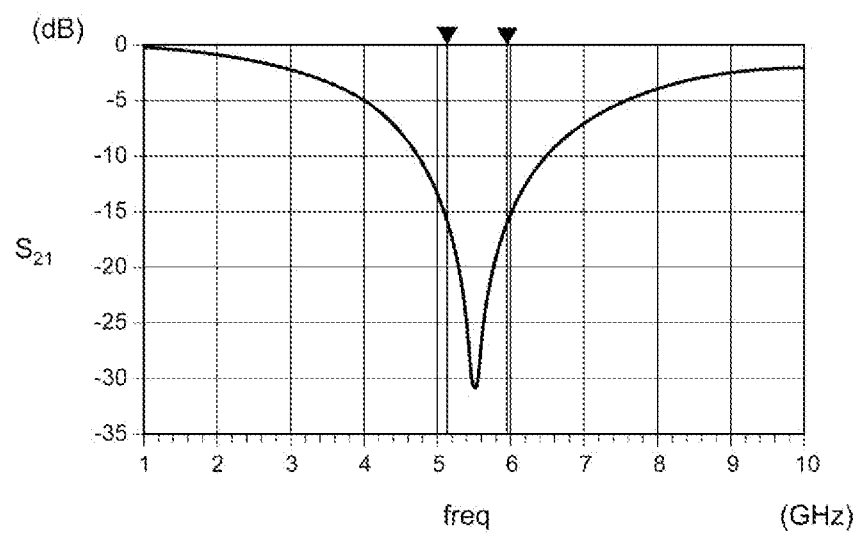
FIG. 6A is a graph illustrating the simulation results of the frequency characteristics of the filter circuit in the semiconductor device shown in FIG. 4 without necessarily bonding wires.
Figure 6B:
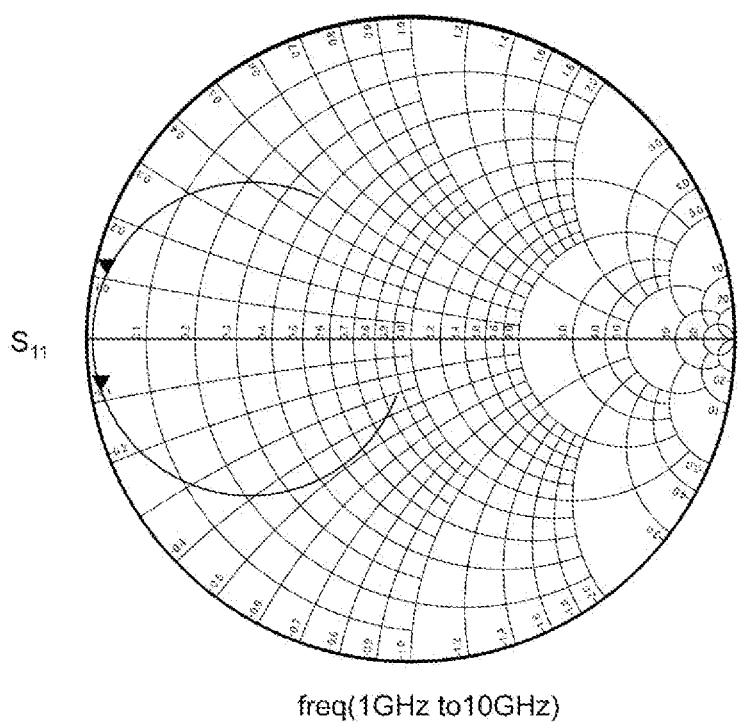
FIG. 6B is a Smith chart illustrating a path of load impedance of the collector of the transistor in the semiconductor device shown in FIG. 4 without necessarily the bonding wires.

FIG. 5A is a graph illustrating the simulation results of the frequency characteristics of a filter circuit 20a' in the semiconductor device 1000 shown in FIG. 4. FIG. 5B is a Smith chart illustrating a path of load impedance of the collector of the transistor Q2 in the semiconductor device 1000 shown in FIG. 4. FIG. 6A is a graph illustrating the simulation results of the frequency characteristics of the filter circuit 20a' in the semiconductor device 1000 shown in FIG. 4 without necessarily the bonding wires BW1 through BW6. FIG. 6B is a Smith chart illustrating a path of load impedance of the collector of the transistor Q2 in the semiconductor device 1000 shown in FIG. 4 without necessarily the bonding wires BW1 through BW6.

More specifically, as in FIG. 3, the graphs shown in FIGS. 5A and 6A indicate the simulation results of the S parameter $S_{21}$ of a signal from the transistor Q2. In the graphs of FIGS. 5A and 6A, the vertical axis indicates the S parameter $S_{21}$ (dB), while the horizontal axis indicates the frequency (GHz). FIGS. 5B and 6B illustrate the path of load impedance of the collector of the transistor Q2 when the frequency of a signal is varied from 1 to 10 GHz. FIGS. 5A and 5B illustrate the results when coupling is generated between the bonding wires BW7' and BW1 shown in FIG. 4. FIGS. 6A and 6B illustrate the results when coupling is not generated between the bonding wires BW7' and BW1 because the bonding wires BW1 through BW6 are not provided.

Upon comparing FIGS. 5A and 6A, the attenuation peak is found to be shifted to the lower frequency side when coupling is generated between the bonding wires BW7' and BW1 from that when coupling is not generated. The curve of the attenuation in FIG. 5A is gentler than that in FIG. 6A and the Q factor in FIG. 5A becomes lower. Upon comparing FIGS. 5B and 6B, parasitic capacitance components are found to be generated due to the distortion and coupling of the inductance components when coupling is generated between the bonding wires BW7' and BW1, unlike a case in which coupling is not generated. The generation of parasitic capacitance components is due to the generation of coupling between the collector wiring (bonding wires BW1 through BW6) of the transistor Q2 and the wiring of the filter circuit 20a' (bonding wire BW7'). Decreasing the coupling capacitance between the collector wiring and the wiring of the filter circuit to a minimal level may improve the Q factor of the filter circuit 20a and also eliminate parasitic capacitance components caused by the distortion and coupling of inductance components.

Referring back to FIG. 2, the first embodiment will continue to be described. Regarding the above-described two issues, to address the first issue, that is, to reduce a difference in the length from the finger to the filter circuit 20a, the semiconductor device 100A includes the filter circuits 20a and 20b having similar characteristics. More specifically, the filter circuit 20a is disposed at one side of the HBT region 120 and the filter circuit 20b is disposed at the other side of the HBT region 120. With this configuration, harmonics of the amplified signal RFout2 output from the collector of each finger are attenuated by one of the filter circuits 20a and 20b positioned closer to the corresponding finger. The longest distance from the collector of the finger to the capacitor C1a of the filter circuit 20a and that from the collector of the finger to the capacitor C1b of the filter circuit 20b are about half the length X. In the semiconductor device 100A, the difference in the frequency characteristics of each of the filter circuits 20a and 20b according to the position of the finger can be reduced to be smaller than that in the configuration in which only one filter circuit is provided. It is thus possible to reduce a deviation in the frequency of a signal to be attenuated by the filter circuits 20a and 20b, thereby enhancing the controllability of harmonics.

To address the second issue, that is, to reduce the generation of coupling between wirings, in the semiconductor device 100A, the extending direction of the bonding wires BW7a and BW7b with respect to the extending direction of the bonding wires BW1 and BW6 connected to the terminals T1 and T6 is set as follows. On the main surface of the semiconductor chip 110A, the angle between the extending direction of the bonding wires BW7a and BW7b and the extending direction (Y-axis positive direction) of the bonding wires BW1 through BW6 is about 90 to 180 degrees. When the angle is about 90 degrees, the bonding wires BW7a and BW7b are disposed substantially perpendicularly to the bonding wires BW1 through BW6. When the angle is about 180 degrees, the bonding wires BW7a and BW7b are disposed in a direction opposite the extending direction of the bonding wires BW1 through BW6. The extending direction of the bonding wires BW1 through BW6 is a direction from the terminals T1 through T6 toward the outside of the semiconductor chip 110A. The extending direction of the bonding wires BW7a and BW7b is a direction from the terminals T7a and T7b toward the terminals T8a and T8b, respectively.

This will be explained more specifically by taking the bonding wire BW7$a_y$ as an example. The extending direction of the bonding wire BW7$a_y$ (X-axis positive direction and Y-axis negative direction) and the extending direction of the bonding wires BW1 through BW6 (Y-axis positive direction: indicated by the long dashed double-dotted arrow in FIG. 2) form two angles, that is, θa and φa. The angle θa satisfies the above-described condition, that is, about 90 to 180 degrees. Likewise, the angle between the bonding wire BW7$a_x$ and the extending direction of the bonding wires BW1 through BW6 is about 90 degrees, while the angle between the bonding wire BW7$a_z$ and the extending direction of the bonding wires BW1 through BW6 is about 180 degrees. In this manner, the bonding wire BW7a is disposed such that the angle θa will be in a range of about 90 to 180 degrees. In accordance with the position of the bonding wire BW7a, the terminal T8a is disposed at one of the positions T8$a_x$, T8$a_y$, and T8$a_z$.

Similarly, in the filter circuit 20b, the bonding wire BW7b is disposed such that the angle θb will be in a range of about 90 to 180 degrees. In accordance with the position of the bonding wire BW7b, the terminal T8b is disposed at one of the positions T8$b_x$, T8$b_y$, and T8$b_z$.

The bonding wires BW1 through BW6 and the bonding wires BW7a and BW7b of the filter circuits 20a and 20b are not adjacent to each other, and also, the extending directions thereof are different from each other, thereby reducing the generation of coupling between the wirings. It is thus possible to implement the filter characteristics shown in FIGS. 6A and 6B while avoiding a decrease in the Q factor and distortion and coupling of the inductance components observed in FIGS. 5A and 5B. That is, the degradation of the characteristics of the filter circuits 20a and 20b is reduced, and the controllability of harmonics is enhanced.

In accordance with the extending direction of the bonding wires BW7a and BW7b, the terminals T8a and T8b to which a ground potential is supplied may be disposed within the semiconductor chip 110A or outside the semiconductor chip 110A, as shown in FIG. 2.

FIG. 7 is a diagram illustrating an example of the arrangement of a semiconductor device 100B according to a second embodiment of the disclosure. The semiconductor device 100B is different from the semiconductor device 100A of the first embodiment in that it also includes a filter circuit 20c at the input side of the transistor Q2 to attenuate harmonics of an input signal. In the second through sixth embodiments, only different points from the first embodiment will be described while omitting a description of the same points as those of the first embodiment, and similar advantages obtained by similar configurations will not be discussed.

The filter circuit 20c (third filter circuit) includes a capacitor C1c, terminals T7c and T8c, and a bonding wire BW7c, in a manner similar to the filter circuits 20a and 20b. One end of the capacitor C1c (third capacitor) is electrically connected to the base of each finger formed in the HBT region 120. The capacitors C1a, C1b, and C1c are disposed on a semiconductor chip 100B and at the periphery of the HBT region 120, for example. The other end of the capacitor C1c is connected to the terminal T7c disposed adjacent to the capacitor C1c. The bonding wire BW7c (fourth wiring) extends from the terminal T7c to the terminal T8c (third ground terminal) and connects the other end of the capacitor C1c to a ground.

As in the above-described filter circuits 20a and 20b, the constants of the capacitor C1c and the bonding wire BW7c of the filter circuit 20c are determined so that the resonant frequency of the filter circuit 20c may coincide with the frequency of second- or third-order harmonics of the amplified signal RFout1, for example. The filter circuit 20c thus serves as a harmonic termination circuit that short-circuits second- or third-order harmonics of the amplified signal RFout1 to a ground.

As in the filter circuits 20a and 20b, in the filter circuit 20c, the bonding wire BW7c is disposed so that the angle θc between the extending direction of the bonding wire BW7c and the extending direction of the bonding wires BW1 through BW6 will satisfy the condition, that is, about 90 to 180 degrees. This can reduce the generation of coupling between the bonding wires BW1 through BW6 and the bonding wire BW7c.

The semiconductor device 100B configured as described above also achieves advantages similar to those of the semiconductor device 100A of the first embodiment. Additionally, the filter circuit 20c is also provided at the input side of the transistor Q2, so that the waveform of the output voltage of the transistor Q2 can be formed closer to square waves. Hence, the semiconductor device 100B can further increase output power while maintaining high efficiency than the semiconductor device 100A.

Although only one filter circuit is provided at the input side of the transistor Q2 in FIG. 7, two filter circuits may be provided, as those at the output side of the transistor Q2.

Figure 8:
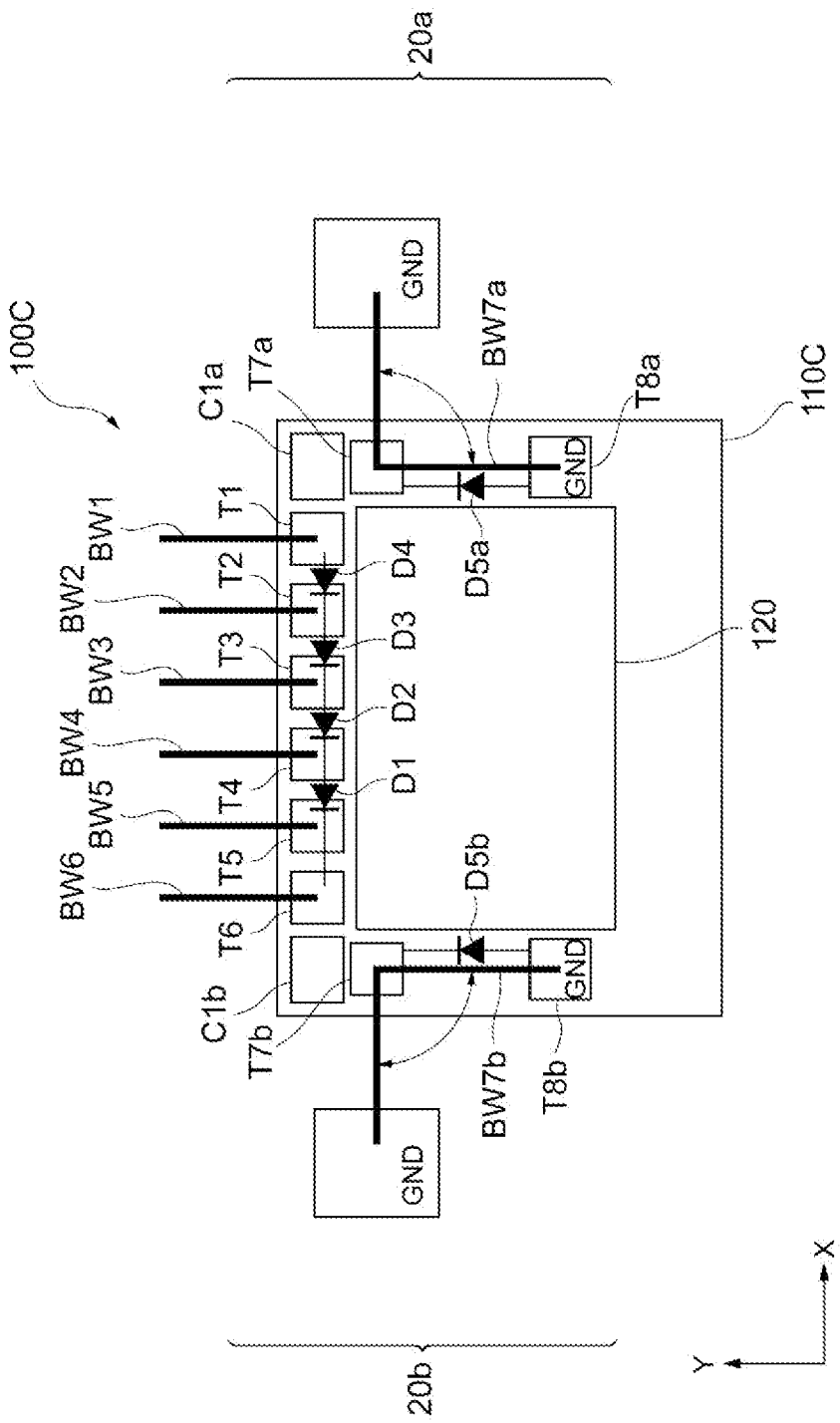
FIG. 8 is a diagram illustrating an example of the arrangement of a semiconductor device according to a third embodiment of the disclosure.

FIG. 8 is a diagram illustrating an example of the arrangement of a semiconductor device 100C according to a third embodiment of the disclosure. The semiconductor device 100C is different from the semiconductor device 100A in that it also includes protection diodes D1 through D4, D5a, and D5b.

The protection diodes D1 through D4 are connected in series with each other between the collector of the transistor Q2 and a ground. More specifically, among the plural protection diodes D1 through D4, the anodes of the protection diodes disposed on one side are connected to a ground, while the cathodes of the protection diodes disposed on the other side are connected to the collector of the transistor Q2. This configuration protects the HBT from the overvoltage destruction.

The anodes of the protection diodes D5a and D5b are respectively connected to the terminals T8a and T8b, and the cathodes thereof are respectively connected to the terminals T7a and T7b. The protection diodes D5a and D5b serve as protection circuits for the capacitance generated when the bonding wires BW7a and BW7b are formed.

The protection diodes D1 through D4, D5a, and D5b are pad on elements (POEs). More specifically, in a direction normal to the main surface of a semiconductor chip 110C, the protection diodes D1 through D4 are disposed under the terminals T1 through T6 so that they can each overlap at least one of the corresponding terminals T1 through T6 (plural pads). Likewise, in a direction normal to the main surface of the semiconductor chip 110C, the protection diode D5a is disposed under the terminals T7a and T8a so as to overlap them, while the protection diode D5b is disposed under the terminals T7b and T8b so as to overlap them. With this configuration, the area of the semiconductor chip 110C can be reduced to be smaller than the configuration in which protection diodes do not overlap corresponding pads.

The semiconductor device 100C configured as described above also achieves advantages similar to those of the semiconductor device 100A of the first embodiment. The number of protection diodes D1 through D4 and that of protection diodes D5a and D5b are not restricted to those shown in FIG. 8.

FIG. 9 is a diagram illustrating an example of the arrangement of a semiconductor device 100D according to a fourth embodiment of the disclosure. The semiconductor device 100D is different from the semiconductor device 100A in that the individual terminals are constituted by bumps instead of pads. That is, when the semiconductor device 100D is mounted on a module substrate, it is electrically connected to the electrodes on the module substrate by using the bumps instead of wire bonding.

More specifically, a semiconductor chip 110D includes bumps P1 through P4, P5a, and P5b. The bumps P1 through P4 (plural output terminals) are electrically connected to the collector of the transistor Q2 shown in FIG. 1. In the fourth embodiment, in a plan view of the main surface of the semiconductor chip 110D, the bumps P1 through P4 are copper (Cu) pillar bumps formed in a substantially rectangular shape having a longer length in the X-axis direction and a shorter length in the Y-axis direction. The bumps P1 and P2 are arranged side by side and also the bumps P3 and P4 are arranged side by side in the X-axis direction between the capacitors C1a and C1b on the main surface of the semiconductor chip 110D.

The bumps P5a and P5b are electrically connected to the other ends of the capacitors C1a and C1b, respectively. When the semiconductor device 100D is mounted on a module substrate, the bumps P5a and P5b are respectively connected to ground electrodes on the module substrate via wirings W1a and W1b and via-electrodes V1a and V1b on the module substrate. With this configuration, the other ends of the capacitors C1a and C1b are connected to a ground. Additionally, inductance components accompanying the wirings extending from the other ends of the capacitors C1a and C1b to the ground electrodes form the inductors L3a and L3b shown in FIG. 1. The bumps P5a and P5b are substantially circular Cu pillar bumps, for example.

The semiconductor device 100D configured as described above also achieves advantages similar to those of the semiconductor device 100A of the first embodiment. The semiconductor device 100D is mountable without necessarily using bonding wires, and thus, coupling between bonding wires, such as that shown in FIG. 4, is not generated. The semiconductor device 100D is mountable on a module substrate without necessarily using bonding wires, and the area of the module substrate on which the semiconductor chip 110D is mounted can thus be reduced.

In the configuration shown in FIG. 9, when the semiconductor device 100D is mounted on a module substrate, the other ends of the capacitors C1a and C1b are connected to the ground electrodes via the wirings W1a and W1b and the via-electrodes V1a and V1b, respectively. However, the bumps P5a and P5b may directly be connected to the ground electrodes on the module substrate.

FIG. 10 is a diagram illustrating an example of the arrangement of a semiconductor device 100E according to a fifth embodiment of the disclosure. The semiconductor device 100E is different from the semiconductor device 100D of the fourth embodiment in that it also includes a filter circuit 20c at the input side of the transistor Q2 to attenuate harmonics of an input signal.

The filter circuit 20c (third filter circuit) includes a capacitor C1c and a bump P5c, in a manner similar to the filter circuits 20a and 20b. One end of the capacitor C1c is connected to the base of the transistor Q2, and the other end thereof is connected to the bump P5c located adjacent to the capacitor C1c. The bump P5c is connected to a ground via a wiring W1c and a via-electrode V1c formed on a module substrate. The function of the filter circuit 20c is similar to that of the filter circuit 20c in the semiconductor device 100B, and a detailed explanation thereof will thus be omitted.

The semiconductor device 100E configured as described above also achieves advantages similar to those of the semiconductor device 100D of the fourth embodiment. Additionally, the filter circuit 20c is also provided at the input side of the transistor Q2, so that the waveform of the output voltage of the transistor Q2 can be formed closer to square waves. Hence, the semiconductor device 100E can further increase output power while maintaining high efficiency than the semiconductor device 100D.

Although only one filter circuit is provided at the input side of the transistor Q2 in FIG. 10, two filter circuits may be provided, as those at the output side of the transistor Q2.

FIG. 11 is a schematic circuit diagram of a semiconductor device 100F according to a sixth embodiment of the disclosure and also schematically illustrates an example of the arrangement of the semiconductor device 100F. In the semiconductor device 100F, the matching network 12 shown in FIG. 1 also serves as a filter circuit which attenuates second-order harmonics of the amplified signal RFout2. In FIG. 11, the configuration of the transistor Q2 and the subsequent stages are only shown, and the configuration of the stages preceding the transistor Q2 is not shown.

The matching network 12 includes a capacitor C2 and inductors L4 through L6. One end of the capacitor C2 (fourth capacitor) is connected to the collector of the transistor Q2, and the other end thereof is connected to the other end of the inductor L5 via the inductor L6. The capacitor C2 is an on-chip capacitor directly formed on a semiconductor chip 110F, for example. The inductor L6 may be a bonding wire that electrically connects the other end of the capacitor C2 to the outside of the semiconductor chip 110F.

The inductor L4 is a bonding wire that electrically connects the collector of the transistor Q2 to the outside of the semiconductor chip 110F. The inductor L4 is connected to one end of the inductor L5. The inductor L5 (fifth wiring) is, for example, a wiring formed on a module substrate which mounts the semiconductor chip 110F thereon. The inductor L5 is connected at one end to the inductor L4 and outputs the amplified signal RFout2 from the other end. The inductor L5 may be constituted by a microstrip line, for example.

As shown in FIG. 11, in the matching network 12, the capacitor C2 and the series-connected inductors L4 and L5 are connected in parallel with each other. The capacitance of the capacitor C2 and the inductance of the inductors L4 and L5 form a filter circuit 30 (fourth filter circuit) having a function of a parallel resonance circuit. If the capacitance value of the capacitor C2 and the inductance values of the inductors L4 and L5 are determined so that the resonant frequency of the filter circuit 30 may coincide with the frequency of second-order harmonics of the amplified signal RFout2, the frequency of second-order harmonics can be attenuated. In this case, in the semiconductor device 100F, second-order harmonics are opened by the filter circuit 30, while third-order harmonics are terminated by the filter circuits 20a and 20b. As a result, the characteristics of inverse class F operation are further improved than the configuration without necessarily the filter circuit 30.

The resonant frequency of the filter circuit 30 is not restricted to the frequency of second-order harmonics and may be the frequency of another type of even-order harmonics. If the transistor Q2 operates as a class F power amplifier to perform class F operation, the resonant frequency of the filter circuits 20a and 20b may be set to be the frequency of even-order harmonics (second-order harmonics, for example), and the resonant frequency of the filter circuit 30 may be set to be the frequency of odd-order harmonics (third-order harmonics, for example). Instead of using the matching network 12 as the filter circuit 30, a dedicated filter circuit for attenuating second-order harmonics may separately be provided.

The embodiments of the disclosure have been discussed above. The semiconductor devices 100A through 100F each include, on the semiconductor chips 110A through 110F, plural output terminals (terminals T1 through T6 or bumps P1 through P4) arranged side by side in the X-axis direction and filter circuits 20a and 20b that attenuate harmonics of the amplified signal RFout2. The capacitor C1a included in the filter circuit 20a is disposed on the positive side of the X-axis direction with respect to the plural output terminals, while the capacitor C1b is disposed on the negative side of the X-axis direction with respect to the plural output terminals. Harmonics of the amplified signal RFout2 output from each finger of the transistor Q2 are attenuated by one of the filter circuits 20a and 20b positioned closer to the corresponding finger. The difference in the distance from the collector of the finger to the filter circuit 20a or 20b can be reduced to be smaller than that in the configuration in which only one filter circuit is provided. It is thus possible to reduce a deviation in the resonant frequency of the filter circuits 20a and 20b.

In the semiconductor devices 100A through 100C and 100F, the angle between the extending direction of the bonding wires BW7a and BW7b and the extending direction of the bonding wires BW1 through BW6 is about 90 to 180 degrees, thereby reducing the generation of coupling between the bonding wires BW7a and BW7b and the bonding wires BW1 through BW6. It is thus possible to suppress a decrease in the Q factor of the filter circuits 20a and 20b and to reduce distortion and coupling of the inductance components, thereby enhancing the controllability of harmonics by the filter circuits 20a and 20b.

At least one of the bonding wires BW7a and BW7b may extend substantially perpendicularly to the bonding wires BW1 through BW6. The terminals T8a and T8b to which a ground potential is supplied may be disposed outside the semiconductor chips 110A through 110C and 110F.

At least one of the bonding wires BW7a and BW7b may extend in a direction substantially opposite the extending direction of the bonding wires BW1 through BW6. The terminals T8a and T8b to which a ground potential is supplied may be disposed within the semiconductor chips 110A through 110C and 110F.

The semiconductor device 100B also includes the filter circuit 20c which attenuates harmonics of an input signal. The angle between the extending direction of the bonding wire BW7c included in the filter circuit 20c and the extending direction of the bonding wires BW1 through BW6 is about 90 to 180 degrees. In the semiconductor device 100B, the waveform of the output voltage of the transistor Q2 can be formed closer to square waves. The semiconductor device 100B can thus further increase output power while maintaining high efficiency than the semiconductor device 100A.

The semiconductor device 100C also includes the protection diodes D1 through D4 for the transistor Q2. In a direction normal to the main surface of the semiconductor chip 110C, the protection diodes D1 through D4 are disposed to overlap the pads. With this configuration, the area of the semiconductor chip 110C can be reduced to be smaller than the configuration in which the protection diodes D1 through D4 do not overlap the pads.

In the semiconductor devices 100D and 100E, the plural output terminals of the transistor Q2 are constituted by the bumps P1 through P4. The semiconductor devices 100D and 100E are mountable without necessarily using bonding wires, and thus, coupling between bonding wires is not generated. Additionally, the area of a module substrate on which the semiconductor chip 110D or 110E is mounted can be reduced.

The semiconductor device 100E also includes the filter circuit 20c which attenuates harmonics of an input signal. In the semiconductor device 100E, the waveform of the output voltage of the transistor Q2 can be formed closer to square waves. The semiconductor device 100E can thus further increase output power while maintaining high efficiency than the semiconductor device 100D.

The resonant frequency of the filter circuits 20a through 20c is not restricted to a particular frequency and may be the frequency of second-order harmonics of the amplified signal RFout2, for example. This makes the transistor Q2 serve as a class F power amplifier performing class F operation, thereby enhancing the linearity and efficiency of the transistor Q2.

In the semiconductor devices 100A through 100F, the resonant frequency of the filter circuits 20a and 20b is the frequency of third-order harmonics of the amplified signal RFout2. This makes the transistor Q2 serve as an inverse class F power amplifier performing inverse class F operation, thereby further enhancing the linearity and efficiency of the transistor Q2 than when the transistor Q2 performs class F operation.

The semiconductor device 100F also includes the filter circuit 30 which is connected in series with the collector of the transistor Q2 and which attenuates second-order harmonics of the amplified signal RFout2. Second-order harmonics are thus opened in the output path. It is thus possible to further improve the characteristics of inverse class F operation than the configuration without necessarily the filter circuit 30.

The above-described embodiments are provided for facilitating the understanding of the disclosure but are not intended to be exhaustive or to limit the disclosure to the precise forms disclosed. Modifications and/or improvements may be made without departing from the scope and spirit of the disclosure, and equivalents of the disclosure are also encompassed in the disclosure. That is, suitable design changes made to the embodiments by those skilled in the art are also encompassed in the disclosure within the scope and spirit of the disclosure. For example, the elements of the embodiments and the positions, materials, conditions, configurations, and sizes thereof are not restricted to those described in the embodiments and may be changed in an appropriate manner. The elements of the embodiments may be combined within a technically possible range, and configurations obtained by combining the elements of the embodiments are also encompassed in the disclosure within the scope and spirit of the disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a chip having a main surface in a plane defined by first and second orthogonal directions;
    a power amplifier configured to amplify an input signal and output an amplified signal from a plurality of output terminals; and
    first and second filter circuits configured to attenuate harmonics of the amplified signal, wherein
    the first filter circuit comprises a first capacitor connected between the plurality of output terminals and ground,
    the second filter circuit comprises a second capacitor connected between the plurality of output terminals and ground,
    the plurality of output terminals are disposed adjacent to each other in the first direction along a first side of the main surface of the chip,
    the first capacitor is disposed at a first end of the plurality of output terminals along the first direction, and the second capacitor is disposed at a second end of the plurality of output terminals along the first direction, the first end being opposite the second end.

2. The semiconductor device according to claim 1, wherein,
    the first filter circuit comprises a first wiring extending from a first end of the first capacitor to a first ground terminal, and
    the second filter circuit comprises a second wiring extending from a first end of the second capacitor to a second ground terminal,
    the semiconductor device further comprising:
    a plurality of third wirings extending from the plurality of output terminals in the second direction,
    wherein an angle between the first wiring and one of the plurality of third wirings is between 90 and 180 degrees, and
    an angle between the second wiring and one of the plurality of third wirings is between 90 and 180 degrees.

3. The semiconductor device according to claim 2, wherein:
    the first wiring or the second wiring is substantially perpendicular to one of the plurality of third wirings, and
    the first ground terminal or the second ground terminal is disposed off the chip.

4. The semiconductor device according to claim 3, further comprising:
    a third filter circuit configured to attenuate harmonics of the input signal, wherein
    the third filter circuit comprises a third capacitor and a fourth wiring, the input signal being supplied to a first end of the third capacitor, and the fourth wiring extending from a second end of the third capacitor to a third ground terminal, and
    an angle between the fourth wiring and one of the plurality of third wirings is between 90 and 180 degrees.

5. The semiconductor device according to claim 3, further comprising:
   a third filter circuit configured to attenuate harmonics of the input signal, wherein
   the third filter circuit comprises a third capacitor and a fourth wiring, the input signal being supplied to a first end of the third capacitor, and the fourth wiring extending from a second end of the third capacitor to a third ground terminal, and
   an angle between the fourth wiring and one of the plurality of third wirings is between 90 and 180 degrees.

6. The semiconductor device according to claim 3, further comprising:
   a protection diode connected between the plurality of output terminals and ground; and
   a plurality of pads that form the plurality of respective output terminals,
   wherein the protection diode overlaps one of the plurality of pads in a direction normal to the main surface of the chip.

7. The semiconductor device according to claim 3, wherein a resonant frequency of the first and second filter circuits is a frequency of a second-order harmonic of the amplified signal.

8. The semiconductor device according to claim 2, wherein:
   the first wiring or the second wiring extends in a substantially opposite direction to one of the plurality of third wirings; and
   the first ground terminal or the second ground terminal is disposed on the chip.

9. The semiconductor device according to claim 8, further comprising:
   a protection diode connected between the plurality of output terminals and ground; and
   a plurality of pads that form the plurality of respective output terminals,
   wherein the protection diode overlaps one of the plurality of pads in a direction normal to the main surface of the chip.

10. The semiconductor device according to claim 8, wherein a resonant frequency of the first and second filter circuits is a frequency of a second-order harmonic of the amplified signal.

11. The semiconductor device according to claim 2, further comprising:
   a third filter circuit configured to attenuate harmonics of the input signal, wherein
   the third filter circuit comprises a third capacitor and a fourth wiring, the input signal being supplied to a first end of the third capacitor, and the fourth wiring extending from a second end of the third capacitor to a third ground terminal, and
   an angle between the fourth wiring and one of the plurality of third wirings is between 90 and 180 degrees.

12. The semiconductor device according to claim 11, wherein a resonant frequency of the first and second filter circuits is a frequency of a second-order harmonic of the amplified signal.

13. The semiconductor device according to claim 2, wherein a resonant frequency of the first and second filter circuits is a frequency of a second-order harmonic of the amplified signal.

14. The semiconductor device according to claim 2, further comprising:
   a protection diode connected between the plurality of output terminals and ground; and
   a plurality of pads that form the plurality of respective output terminals,
   wherein the protection diode overlaps one of the plurality of pads in a direction normal to the main surface of the chip.

15. The semiconductor device according to claim 1, further comprising:
   a protection diode connected between the plurality of output terminals and ground; and
   a plurality of pads that form the plurality of respective output terminals,
   wherein the protection diode overlaps one of the plurality of pads in a direction normal to the main surface of the chip.

16. The semiconductor device according to claim 1, wherein each of the plurality of output terminals is a bump.

17. The semiconductor device according to claim 16, further comprising:
   a third filter circuit configured to attenuate harmonics of the input signal,
   wherein the third filter circuit comprises a third capacitor, the input signal being supplied to a first end of the third capacitor, and a second end of the third capacitor being grounded.

18. The semiconductor device according to claim 1, wherein a resonant frequency of the first and second filter circuits is a frequency of a second-order harmonic of the amplified signal.

19. The semiconductor device according to claim 1, wherein a resonant frequency of the first and second filter circuits is a frequency of a third-order harmonic of the amplified signal.

20. The semiconductor device according to claim 19, further comprising:
   a fourth filter circuit that is connected in series with the plurality of output terminals and that is configured to attenuate second-order harmonics of the amplified signal,
   wherein the fourth filter circuit comprises a fourth capacitor and a fifth wiring connected in parallel with each other.

* * * * *